(12) United States Patent
Kim et al.

(10) Patent No.: US 7,034,360 B2
(45) Date of Patent: Apr. 25, 2006

(54) HIGH VOLTAGE TRANSISTOR AND METHOD OF MANUFACTURING THE SAME

(75) Inventors: Yong Wook Kim, Icheon-Shi (KR); Dong Kee Lee, Icheon-Shi (KR); Hee Hyun Chang, Seongnam-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/878,273

(22) Filed: Jun. 28, 2004

(65) Prior Publication Data

US 2005/0104123 A1 May 19, 2005

(51) Int. Cl.
*H01L 29/76* (2006.01)
*H01L 21/336* (2006.01)

(52) U.S. Cl. ............... 257/336; 257/344; 257/752; 438/306; 438/637

(58) Field of Classification Search ......... 257/327, 257/335, 336, 344, 752; 438/299, 301, 305, 438/306, 637
See application file for complete search history.

(56) References Cited

U.S. PATENT DOCUMENTS 5,519,239 A * 5/1996 Chu ..................... 257/314
2002/0016081 A1 * 2/2002 Aloni et al. ........... 438/714
2003/0042552 A1 * 3/2003 Chae ...................... 257/384

FOREIGN PATENT DOCUMENTS

KR 1020000006396 A 1/2000

* cited by examiner

*Primary Examiner*—T. N. Quach
(74) *Attorney, Agent, or Firm*—Marshall, Gerstein & Borun LLP

(57) ABSTRACT

Provided is a high voltage transistor in a flash memory device comprising: a source/drain junction of a DDD structure consisting of a high-concentration impurity region and a low-concentration impurity region surrounding the high-concentration impurity region, the high-concentration impurity region being formed in parallel with a gate electrode at a distance spaced by a location in which a contact hole is formed, and having a rectangular shape whose width is the same as or wider than that of the contact hole and whose length is the same as or narrower than that of an active region through which the gate electrode passes. Accordingly, a current density to pass the gate electrode neighboring the contact hole portion and a current density to pass the gate electrode at a portion where the contact hole cannot be formed become uniform. A uniform and constant saturation current can be obtained regardless of the number of the contact hole.

9 Claims, 4 Drawing Sheets

HIGH VOLTAGE TRANSISTOR AND METHOD OF MANUFACTURING THE SAME

BACKGROUND

1. Field of the Invention

The present invention relates to a high voltage transistor in a flash memory device and, more specifically, to a high voltage transistor in a flash memory device that can obtain a uniform and constant saturation current regardless of the number of a contact hole in a source/drain junction having a double diffused drain (hereinafter, referred to as "DDD") structure consisting of a high-concentration impurity region and a low-concentration impurity region surrounding the high-concentration impurity region.

2. Discussion of Related Art

Semiconductor memory devices may be classified into random access memory (RAM) products, which are volatile, lose data as time goes and are fast to read from and write to, such as dynamic random access memory (DRAM) and static random access memory (SRAM), and read only memory (ROM) products, which retain data once they are inputted, but are low to read from and write to. Of these ROM products, there is an increasing demand for an electrically erasable and programmable ROM (EEPROM) or a flash memory to/from which data can be inputted/outputted electrically. The flash memory device is an advanced version of EEPROM, which can be electrically erased at high speed, while being not removed from a circuit board. The flash memory device has advantages that the manufacturing cost per unit memory is cheap due to a simple memory cell structure and a refresh function for retaining data is unnecessary. The flash memory is, however, disadvantageous that a write and erase rate of data, several hundreds of □ to several ms, is significantly lower than several tens of ns of the RAM products.

When viewing a flash memory device from a circuit's viewpoint, the operating speed is high since each memory cell can be independently controlled. The flash memory cell can be classified into a NOR type that is large in cell area since one contact is necessary every two cells, and a NAND type that is advantageous in higher degree of integration since several memory cells can be controlled as a single bundle.

In an NAND type flash memory device, a cell transistor that is operated by an external peripheral circuit has a structure in which a first gate that is floated and a second gate that controls the first gate are stacked. A program operation of a cell is performed as some of channel hot electrons are injected into the first gate through a tunnel oxide film by means of fowler-nordheim (F-N) tunneling or hot electron injection. In order to perform such program operation, a voltage of 0V is applied to a bulk substrate and a high voltage of 20V or more is applied to the second gate that is provided as a word line of a cell array. In this state, a voltage of 10 M V/cm or more is introduced to both ends of the tunnel oxide film, so that electrons are injected from the substrate to the first gate. Meanwhile, in order to perform an erase operation of the cell, a voltage of OV is applied to the second gate and a voltage of −20V is applied to the bulk substrate, so that electrons injected into the first gate are discharged toward the substrate by a voltage difference between the first gate and the substrate.

As such, the NAND type flash memory device needs an external circuit for driving the cell. This circuit consists of a transistor having a high voltage junction breakdown voltage of usually 20 V or more. A high voltage generated by such a transistor is transferred to the word line of the cell array used as the second gate along the power line made of a conductor such as a metal, thereby programming the cell. As described above, the process of fabricating the transistor for forming the high voltage junction breakdown voltage and transferring the high voltage to the word line is very important. Such a transistor is usually referred to as a 'high voltage transistor' and is formed in a region differentiated from a low voltage transistor whose operating voltage is about Vcc.

FIG. 1 is a layout view illustrating a high voltage transistor in an NAND type flash memory device in a related art, FIG. 2 is a cross-sectional view illustrating the high voltage transistor taken along lines II–II' in FIG. 1, and FIG. 3 is a cross-sectional view illustrating the high voltage transistor taken along lines III–III' in FIG. 1.

Referring to FIG. 1, FIG. 2 and FIG. 3, an isolation film 12 is formed in a given region of a semiconductor substrate 11 by means of a common isolation process, thereby defining an active region in which a cell transistor, a high voltage transistor, a low voltage transistor, etc. will be formed. In the drawings, however, it is to be noted that only the active region in which the high voltage transistor will be formed is shown for simplicity. A threshold voltage control layer is formed on the semiconductor substrate 11 in the active region by injecting an impurity ion in order to optimize the threshold voltage of a channel transistor. A gate insulating film 13 is then formed on the resulting surface. After a conductive material such as polysilicon into which an impurity is doped is deposited on the gate insulating film 13, the material is patterned by a photolithography process, thus forming a gate electrode 14. A low-concentration impurity region 20 is formed in a semiconductor substrate 11 at both sides of the gate electrode 14 by means of a low-concentration impurity ion implantation process. The low-concentration impurity region 20 is formed using an impurity ion having a different conductive type from the semiconductor substrate 11. An interlayer insulating film 15 is then formed on the entire structure including the low-concentration impurity region 20. A portion of the interlayer insulating film 15 is etched to form a contact hole 16 through which a central portion of the low-concentration impurity region 20 is exposed. The reason why the contact hole 16 is formed at the central portion of the low-concentration impurity region 20 is that a junction breakdown voltage can be increased if the distance between a high-concentration impurity region to be formed later and the gate electrode 14 and the distance between the high-concentration impurity region and the isolation film 12 are kept constant. Thereafter, an impurity ion of a higher concentration than the low-concentration impurity region 20 is implanted into the low-concentration impurity region 20 exposed through the contact hole 16 by means of a plug mask process and a plug ion implantation process, so that a high-concentration impurity region 21 is formed in the low-concentration impurity region 20. A source/drain junction 221 of a DDD structure having the high-concentration impurity region 21 and the low-concentration impurity region 20 surrounding the high-concentration impurity region 21 is thereby completed. At this time, the high-concentration impurity region 21 is formed using an impurity ion having the same conductive type as the low-concentration impurity region 20. A conductive material such as polysilicon, tungsten, etc. is filled into the contact hole 16 to form a contact plug 17. A metal wire 18 electrically connected to the contact plug 17 is formed on the interlayer insulating film 15.

In general, in the case of a high voltage transistor used in an NAND type flash memory device, as the number of portions contacting the source/drain junction 221 become many, i.e., the number of the contact hole 16 becomes many, the transistor has the property that the saturation current is reduced, as shown in FIG. 4. FIG. 4 is a graph shown to explain a saturation current characteristic depending on the number of a contact hole in a typical high voltage transistor. Actually, in a high voltage transistor used in a page buffer circuit in an NAND type flash memory device, only one contact hole 16 is formed in the source/drain junction 221, as shown in FIG. 1. A total area of the source/drain junction 221 can contain at least three contact holes. In the high voltage transistor used in the page buffer circuit, however, as the metal wire 18 cannot but pass the high voltage transistor region, it is difficult to additionally form other contact holes. As such, as one contact hole 16 is formed at the central portion of the source/drain junction 221, a current density to pass the gate electrode 14 is high at its center and low toward its edge. Accordingly, in the high voltage transistor used in the page buffer circuit, the current density to pass the gate electrode becomes irregular. Due to this, not only a constant saturation current cannot be obtained, but also the performance of a device is degraded and error in design simulation is caused due to reduction in saturation current.

SUMMARY OF THE INVENTION

The present invention is directed to a high voltage transistor in a flash memory device that can obtain a uniform and constant saturation current regardless of the number of a contact hole in a source/drain junction of a DDD structure having a high-concentration impurity region and a low-concentration impurity region surrounding the high-concentration impurity region.

According to a preferred embodiment of the present invention, there is provided a high voltage transistor, including a high-concentration impurity region that is formed in parallel with a gate electrode at a distance spaced by a location where a contact hole will be formed in a source/drain junction of a DDD structure consisting of a high-concentration impurity region and a low-concentration impurity region surrounding the high-concentration impurity region.

Here, the high-concentration impurity region has a rectangular shape whose width is the same as or wider than that of the contact hole and whose length is the same as or narrower than that of an active region through which the gate electrode passes.

According to another preferred embodiment of the present invention, there is provided a high voltage transistor, including a gate insulating film formed on a semiconductor substrate in an active region defined by an isolation film; a gate electrode formed on the gate insulating film; a low-concentration impurity region formed in the semiconductor substrate at both sides of the gate electrode; a high-concentration impurity region spaced from the gate electrode by a given distance, the high-concentration impurity region being in parallel with the gate electrode; an interlayer insulating film formed on the entire structure including the high-concentration impurity region; a contact hole formed in the interlayer insulating film, whose bottom becomes a portion of the interlayer insulating film; a contact plug formed by filling the contact hole with a conductive material; and a metal wire electrically connected to the contact plug and formed on the interlayer insulating film.

In the above, the high-concentration impurity region is surround by the low-concentration impurity region, and has a rectangular shape whose width is same as or wider than that of the contact hole and whose length is same as or narrower than that of an active region through which the gate electrode passes.

DETAILED DESCRIPTION OF PREFERRED EMBODIMENTS

Figure 1:
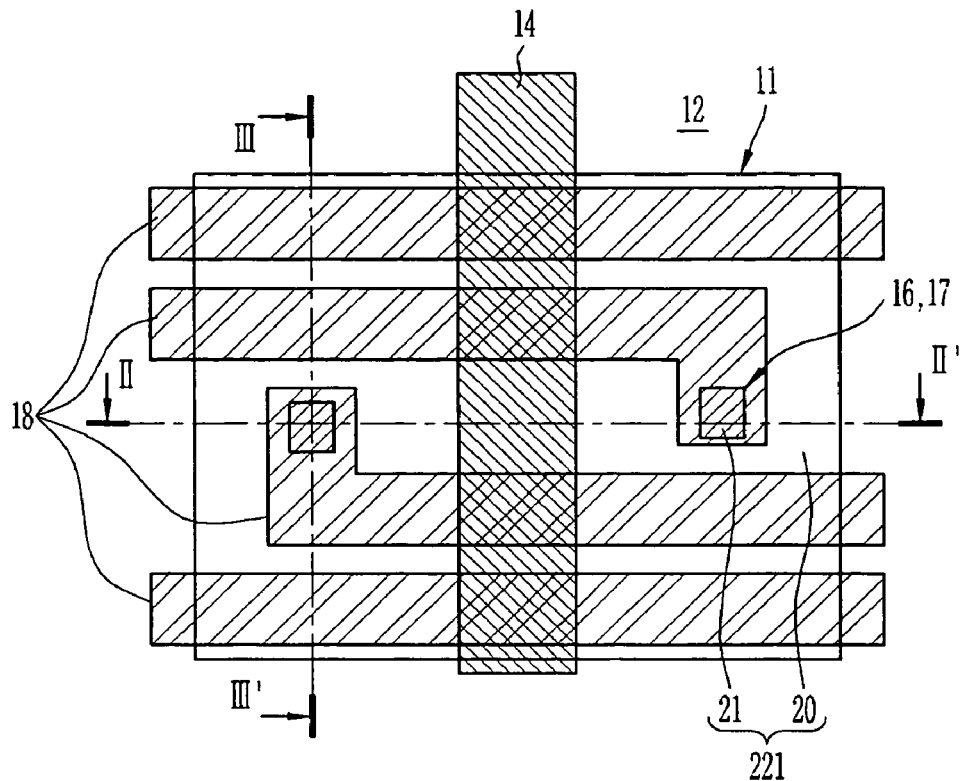
FIG. 1 is a layout view illustrating a high voltage transistor in an NAND type flash memory device in a related art.
Figure 2:
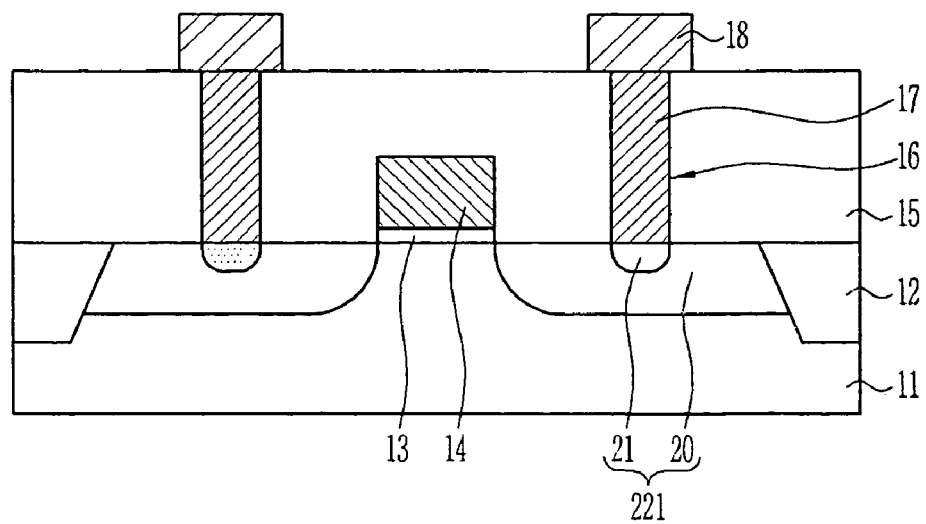
FIG. 2 is a cross-sectional view illustrating the high voltage transistor taken along lines II–II' in FIG. 1.
Figure 3:
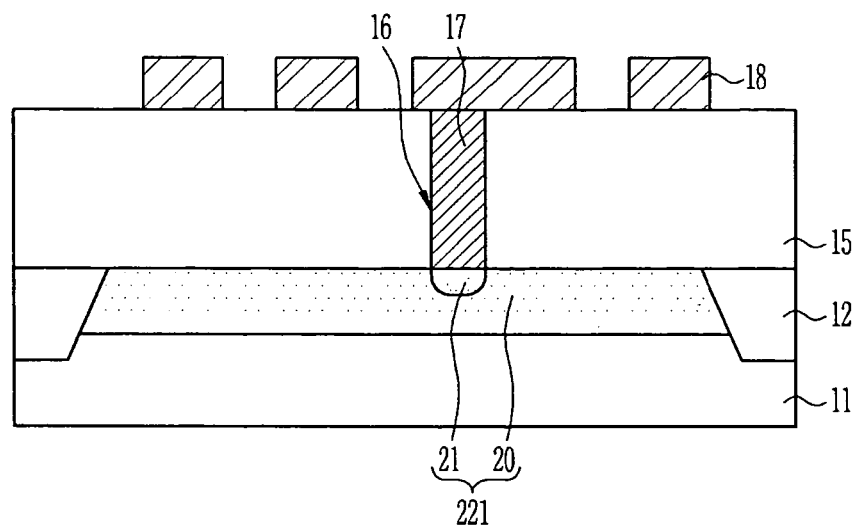
FIG. 3 is a cross-sectional view illustrating the high voltage transistor taken along lines III–III' in FIG. 1.
Figure 4:
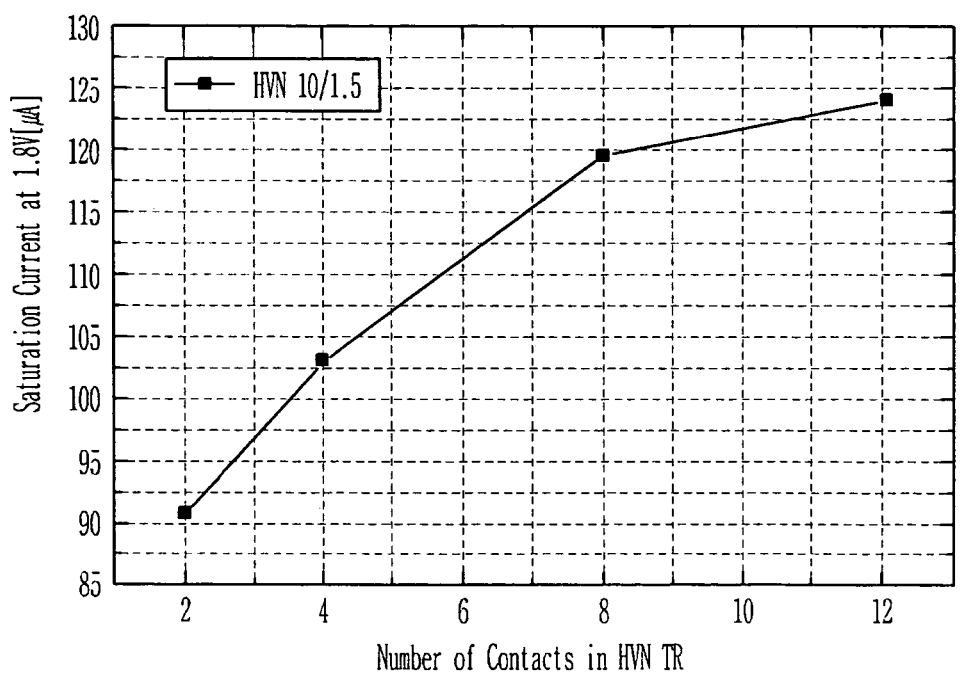
FIG. 4 is a graph shown to explain a saturation current characteristic depending on the number of a contact hole in a typical high voltage transistor.

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Further, in case where it is described that one film is "on" the other film or a semiconductor substrate, the one film may directly contact the other film or the semiconductor substrate. Otherwise, a third film may be intervened between the one film and the other film or the semiconductor substrate. In the drawing, the thickness and size of each layer are exaggerated for convenience of explanation and clarity. Like reference numerals are used to identify the same or similar parts.

Figure 5:
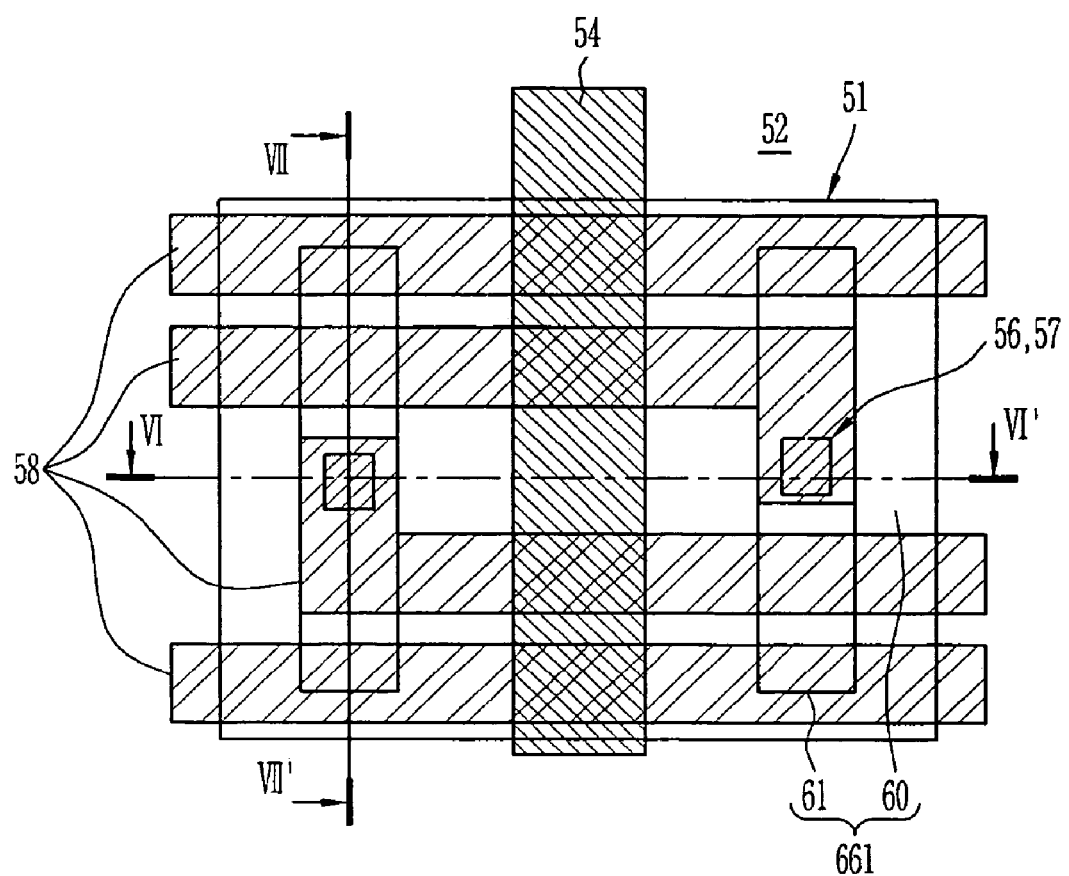
FIG. 5 is a layout view illustrating a high voltage transistor in an NAND type flash memory device according to an embodiment of the present invention.
Figure 6:
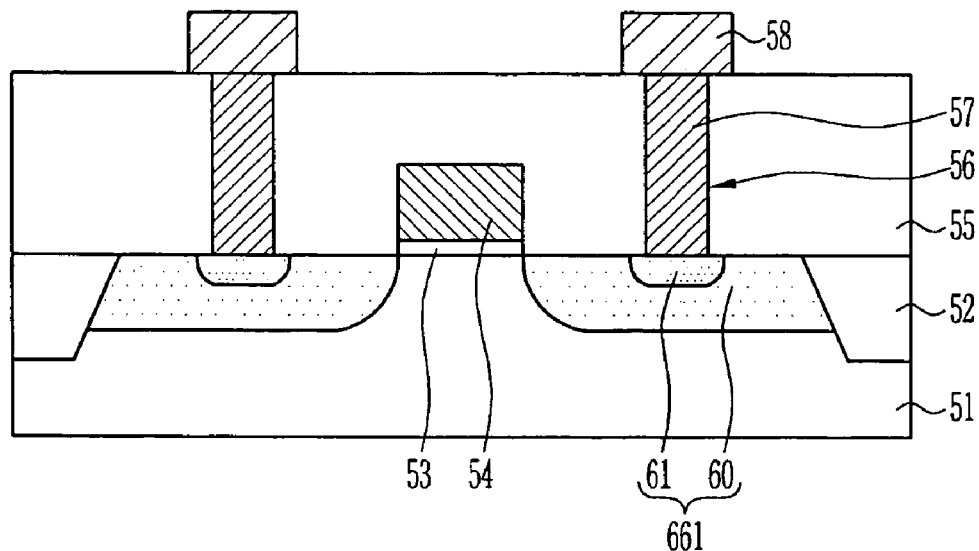
FIG. 6 is a cross-sectional view illustrating the high voltage transistor taken along lines VI–VI' in FIG. 5.
Figure 7:
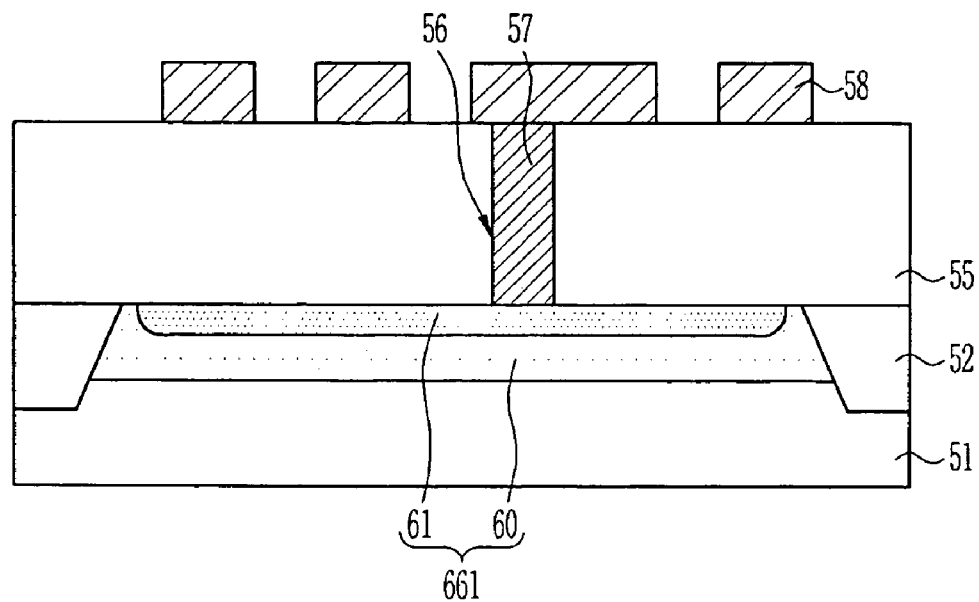
FIG. 7 is a cross-sectional view illustrating the high voltage transistor taken along lines VII–VII' in FIG. 5.

FIG. 5 is a layout view illustrating a high voltage transistor in an NAND type flash memory device according to an embodiment of the present invention, FIG. 6 is a cross-sectional view illustrating the high voltage transistor taken along lines VI–VI' in FIG. 5, and FIG. 7 is a cross-sectional view illustrating the high voltage transistor taken along lines VII–VII' in FIG. 5.

Referring to FIG. 5, FIG. 6 and FIG. 7, an isolation film 52 is formed in a given region of a semiconductor substrate 51 by means of a common isolation process, thereby defining an active region in which a cell transistor, a high voltage transistor, a low voltage transistor, etc. will be formed. In the drawings, however, only an active region in which a high voltage transistor will be formed is shown. A threshold voltage control layer is formed on the semiconductor substrate 51 in the active region by injecting an impurity ion in order to optimize the threshold voltage of a channel transistor. A gate insulating film 53 is then formed on the resulting surface. After a conductive material such as polysilicon into which an impurity is doped is deposited on the gate insulating film 53, the material is patterned by a photolithography process to form a gate electrode 54. A low-concentration impurity region 60 is formed in the semiconductor substrate 51 at both sides of the gate electrode 54 by means of a low-concentration impurity ion implantation process. At this time, the low-concentration impurity region 60 is formed using an impurity ion having a different conductive type from the semiconductor substrate 51. In the case where the high voltage transistor is an NMOS transistor, the low-concentration impurity region 60 is formed by implanting phosphorous (P) as an N type impurity with energy of 60 to 70 keV in a dose of 3E12 to 5E12 atoms/cm$^2$.

A high-concentration impurity region 61 includes a central portion of the low-concentration impurity region 60, i.e., a location of a portion where a contact hole will be formed by a subsequent process. At this time, the high-concentration impurity region 61 is formed in parallel with the gate electrode 54 at a distance spaced by a location where the contact hole will be formed in a rectangular shape whose width is the same as or wider than that of the contact hole and whose length is the same as or narrower than that of an active region through which the gate electrode 54 passes. A source/drain junction 661 of a DDD structure consisting of the high-concentration impurity region 61 and the low-concentration impurity region 60 surrounding the high-concentration impurity region 61 is thus formed. At this time, the high-concentration impurity region 61 is formed using an impurity ion of the same conductive type as the low-concentration impurity region 60. In the case where the high voltage transistor is an NMOS transistor, the high-concentration impurity region 61 is formed by implanting arsenic (As) as an N type impurity with energy of 20 to 30 keV in a dose of 2E15 to 5E15 atoms/cm$^2$. The reason why the high-concentration impurity region 61 is formed in parallel with the gate electrode 54 at a given distance from the gate electrode 54, is for making uniform a current density to pass the entire region of the gate electrode 54 regardless of the number and location of a contact hole to be formed later, while enhancing the properties of a junction breakdown voltage by keeping constant the distance between the high-concentration impurity region 61 and the gate electrode 54 and the distance between the high-concentration impurity region and the isolation film 52.

An interlayer insulating film 55 is formed on the entire structure including the source/drain junction 661. A portion of the interlayer insulating film 55 is etched to form a contact hole 56 through which a portion of the high-concentration impurity region 61 is exposed. A conductive material such as polysilicon, tungsten, etc. is filled into the contact hole 56, thereby forming a contact plug 57. A metal wire 58 electrically connected to the contact plug 57 is formed on the interlayer insulating film 55.

As well known in the art, a high voltage transistor used in an NAND type flash memory device has the property that the greater a portion contacting a source/drain junction, the smaller the saturation current. In the NAND type flash memory device, a metal wire of a high voltage transistor used in a page buffer circuit cannot but pass a high voltage transistor region. It is thus difficult to form a large number of contact holes in the source/drain junction. In order to solve problems occurring due to this, according to the present invention, in the source/drain junction 661 of the DDD structure consisting of the high-concentration impurity region 61 and the low-concentration impurity region 60 surrounding the high-concentration impurity region 61, the high-concentration impurity region 61 of a low resistance is formed in parallel with the gate electrode 54 at a distance spaced by the location where the contact hole 56 will be formed in a rectangular shape whose width is the same as or wider than that of the contact hole 56. Accordingly, the current density to pass the gate electrode 54 neighboring the contact hole 56 portion and the current density to pass the gate electrode 54 at a portion where the contact hole 56 cannot be formed become uniform. It is thus possible to obtain a uniform and constant saturation current regardless of the number of the contact hole 56.

According to the present invention described above, a high-concentration impurity region of a low resistance is formed in parallel with a gate electrode. Therefore, the present invention has effects that it can not only enhance reliability and electrical properties of a device since a generally uniform and constant saturation current can be obtained, but can also improve productivity since existing plug mask and plug ion implantation processes can be skipped.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A high voltage transistor, comprising:
a source/drain junction of a DDD structure consisting of a high-concentration impurity region and a low-concentration impurity region surrounding the high-concentration impurity region, the high-concentration impurity region being formed in parallel with a gate electrode at a distance spaced by a location in which a contact hole is formed,
wherein, the high-concentration impurity region has a rectangular shape whose width is wider than that of the contact hole and whose length is the same as or narrower than width of an active region.

2. The high voltage transistor as claimed in claim 1, wherein the low-concentration impurity region is formed by implanting phosphorous (P) with energy 60 to 70 keV in a dose of 3E12 to 5E12 atoms/cm$^2$.

3. The high voltage transistor as claimed in claim 1, wherein the high-concentration impurity region is formed by implanting arsenic (As) with energy of 20 to 30 keV in a dose of 2E15 to 5E15 atoms/cm$^2$.

4. A high voltage transistor, comprising:
a gate insulating film formed on a semiconductor substrate in an active region defined by an isolation film;
a gate electrode formed on the gate insulating film;
a low-concentration impurity region formed in the semiconductor substrate at both sides of the gate electrode;
a high-concentration impurity region spaced from the gate electrode by a given distance, the high-concentration impurity region being in parallel with the gate electrode and having a rectangular shape whose width is wider than that of the contact hole and whose length is the same as or narrower than width of an active region;
an interlayer insulating film formed on the entire structure including the high-concentration impurity region;
a contact hole formed in the interlayer insulating film, whose bottom becomes a portion of the interlayer insulating film;
a contact plug formed by filling the contact hole with a conductive material; and
a metal wire electrically connected to the contact plug and formed on the interlayer insulating film.

5. The high voltage transistor as claimed in claim 4, wherein the low-concentration impurity region is formed by implanting phosphorous (P) with energy 60 to 70 keV in a dose of 3E12 to 5E12 atoms/cm$^2$.

6. The high voltage transistor as claimed in claim 4, wherein the high-concentration impurity region is formed by implanting arsenic (As) with energy of 20 to 30 keV in a dose of 2E15 to 5E15 atoms/cm$^2$.

7. A method of manufacturing a high voltage transistor, the method comprising:

sequentially forming a gate insulating film and a gate electrode on a predetermined region of a semiconductor substrate;

forming a low-concentration impurity region in the semiconductor substrate at both sides of the gate electrode;

forming a high-concentration impurity region spaced from the gate electrode by a given distance, the high-concentration impurity region being in parallel with the gate electrode;

forming an interlayer insulating film on the entire structure after forming the high-concentration impurity region;

etching a portion of the interlayer insulating film to form a contact hole, thereby exposing a portion of the high-concentration impurity region;

filling the contact hole to form a contact plug; and forming a metal wire on the interlayer insulating film for electrically connecting to the contact plug;

wherein the high-concentration impurity region has a rectangular shape whose width is wider than that of the contact hole and whose length is the same as or narrower than width of an active region.

8. The method of manufacturing a high voltage transistor as claimed in claim 7, wherein the low-concentration impurity region is formed by implanting phosphorous (P) with energy 60 to 70 keV in a dose of 3E12 to 5E12 atoms/cm$^2$.

9. The method of manufacturing a high voltage transistor as claimed in claim 7, wherein the high-concentration impurity region is formed by implanting arsenic (As) with energy of 20 to 30 keV in a dose of 2E15 to 5E15 atoms/cm$^2$.

* * * * *

UNITED STATES PATENT AND TRADEMARK OFFICE
CERTIFICATE OF CORRECTION

| | | |
|---|---|---|
| PATENT NO. | : 7,034,360 B2 | Page 1 of 1 |
| APPLICATION NO. | : 10/878273 | |
| DATED | : April 25, 2006 | |
| INVENTOR(S) | : Yong W. Kim et al. | |

It is certified that error appears in the above-identified patent and that said Letters Patent is hereby corrected as shown below:

On the Title Page:

At line (30), please add -- 2003-81957, (KR), November 19, 2003 --.

In the Claims:

At Column 6, line 35, "than width" should be -- than the width --.

At Column 6, line 56, "than width" should be -- than the width --.

At Column 8, line 11, "than width" should be -- than the width --.

Signed and Sealed this

Tenth Day of April, 2007

JON W. DUDAS
*Director of the United States Patent and Trademark Office*